United States Patent [19]
Senda

[11] Patent Number: 6,133,595
[45] Date of Patent: *Oct. 17, 2000

[54] SOLID STATE IMAGING DEVICE WITH IMPROVED GROUND ADHESION LAYER

[75] Inventor: Hiroyuki Senda, Shiga, Japan

[73] Assignee: Matsushita Electronics Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/056,506

[22] Filed: Apr. 7, 1998

[30] Foreign Application Priority Data

Apr. 8, 1997 [JP] Japan ................................ 9-089130

[51] Int. Cl.[7] .......................... H01L 27/148; H01L 29/768
[52] U.S. Cl. ........................ 257/232; 257/233; 257/249; 257/435
[58] Field of Search ................................ 257/232, 233, 257/249, 435

[56] References Cited

U.S. PATENT DOCUMENTS 5,523,609   6/1996   Fukusho ........................... 257/435

FOREIGN PATENT DOCUMENTS 3-174771   7/1991   Japan .
7-30090    1/1995   Japan .

Primary Examiner—Ngân V. Ngô
Attorney, Agent, or Firm—Pearne & Gordon LLP

[57] ABSTRACT

The solid state imaging device of the present invention comprises a light-shielding layer 13 provided with an opening in a photodiode portion and formed through a ground adhesion layer made of one of titanium nitride and titanium on the substrate 1.

20 Claims, 10 Drawing Sheets

SOLID STATE IMAGING DEVICE WITH IMPROVED GROUND ADHESION LAYER

BACKGROUND OF THE INVENTION

1. Field of the Invention

The present invention relates to a solid state imaging device for use in video camera, etc. and a method of fabricating thereof(JP-A 3-174771).

2. Description of the Related Art

In general, a solid state imaging device has an opening in a photodiode portion and a metallic barrier layer covering all the charge transfer portion in order to prevent an error from occurring which is caused by light injection to the charge transfer portion.

A prior art solid state imaging device will be described in connection with the accompanying drawings.

FIG. 10 is a sectional view illustrating an example of the prior art solid state imaging device. In FIG. 10, the reference numeral 1 indicates a semiconductor substrate, the reference numeral 2 indicates a P-type region, the reference numeral 3 indicates an N-type region in a photodiode portion, the reference numeral 4 indicates an $N^-$-type region in a vertical CCD portion, and the reference numeral 5 indicates a $P^{++}$ region. The reference numeral 6 indicates a silicon oxide layer, the reference numeral 7 indicates a silicon nitride layer, the reference numeral a indicates a silicon oxide layer, the reference numeral 9 indicates a polycrystalline silicon electrode, the reference numeral 10 indicates a polycrystalline silicon oxide layer, the reference numeral 11 indicates an interlayer insulating layer, the reference numeral 16 indicates a polycrystalline silicon layer, the reference numeral 13 indicates a light-shielding layer made of tungsten or silicide thereof, the reference numeral 14 indicates an interlayer insulating layer, and the reference numeral 15 indicates a protective layer.

The semiconductor substrate 1 is an N-type silicon substrate. A P-type region 2 is provided along one main plane of the semiconductor substrate 1. Impurities are selectively diffused into the P-type region 2 on the one main plane side of the semiconductor substrate 1 so that an $N^-$-type region 3 in a photodiode portion and an N-type region 4 in a vertical CCD portion are provided a predetermined distance apart from each other.

A silicon oxide layer 6 is provided on the one main plane of the semiconductor substrate 1. A silicon nitride layer 7 is selectively provided on the silicon oxide layer 6. A thin silicon oxide layer 8 is provided on the silicon nitride layer 7.

Provided on the silicon oxide layer 8 is a polycrystalline silicon electrode 9 which acts as a gate electrode formed by CVD method under reduced pressure. A polycrystalline silicon oxide layer 10 is provided covering the top surface and the side edge of the polycrystalline silicon electrode 9 and the side edge of the oxide layer 8 and the silicon nitride layer 7. An interlayer insulating layer 11 formed by CVD method is provided covering the polycrystalline silicon oxide layer 10.

A ground adhesion layer 16 made of polycrystalline silicon and a light-shielding layer 13 made of tungsten or silicide thereof are provided laminated on one another on the interlayer insulating layer 11.

An interlayer insulating layer 14 is provided all over the light-shielding layer 13 and the oxide layer 6. A protective layer 15 is provided on the interlayer insulating layer 14.

The operation of the solid state imaging device having the foregoing structure will be described hereinafter.

The $N^-$-type region 3 formed in the P-type region 2 in the semiconductor substrate 1 is a photodiode portion which undergoes photoelectric conversion to generate signal charge. When a pulse voltage is applied to the polycrystalline silicon electrode 9, signal charge migrates from the $N^-$-type region 3 to the N-type region 4 in the vertical CCD portion under the polycrystalline silicon electrode 9. Subsequently, when a pulse signal is applied alternately to a first layer polycrystalline silicon electrode (not shown) and the foregoing second layer polycrystalline silicon electrode 9, signal charge is transferred.

The light-shielding layer 13 is normally made of a high melting metal, e.g., tungsten or silicide thereof. The light-shielding layer 13 exhibits a high stress and hence an extremely poor adhesion when applied in the form of single layer. Thus, it has been a common practice to provide a ground adhesion layer made of a polycrystalline silicon interposed between the light-shielding layer and the sublayer, relaxing the stress of the light-shielding layer 13 made of tungsten or silicide thereof and hence enhancing the adhesion thereof.

The charge transfer portion, too, is covered by a light-shielding layer made of a high melting metal or silicide thereof(JP-A-7-30090).

FIG. 11 is a sectional view illustrating the portion thus covered. In FIG. 11, the reference numeral 17 indicates a ground adhesion layer made of a polycrystalline silicon. The reference numeral 18 indicates a charge transfer electrode made of a high melting metal such as tungsten or silicide thereof. These layers 17 and 18 are provided on an oxide layer 8 in this order. In other words, the charge transfer electrode 18 is attached to the oxide layer with the ground adhesion layer 17 provided interposed therebetween. Like numerals are used where the constituents are the same as those of FIG. 5.

In operation, the charge transfer electrode 18 is discriminated alternately as a first phase electrode and a second phase electrode. When a pulse voltage is applied to the second phase electrode, signal charge migrates to the N-type region 4 in the vertical CCD portion under the second phase electrode 9 shown in FIG. 10. Subsequently, when a pulse signal is alternately applied to the first phase electrode and the second phase electrode, signal charge is transferred As mentioned above, the charge transfer electrode 18 made of a high melting metal or silicide thereof exhibits a high stress and hence an extremely poor adhesion when applied in the form of single layer. Thus, it has been a common practice to provide a ground adhesion layer 17 made of a polycrystalline silicon interposed between the charge transfer electrode 18 and the sublayer, relaxing the stress of the charge transfer electrode 18 and hence enhancing the adhesion thereof.

However, the foregoing structure is disadvantageous in that the provision of a ground adhesion layer under the light-shielding layer adds to the thickness of the ground layer of the light-shielding layer, causing the multiple reflection of light at the interface of the ground adhesion layer with the adjacent layer that gives a smear component which deteriorates the smear characteristics of the imaging device.

The thicker the thickness of the ground adhesion layer is, the amount of the light in aslant penetrate through the ground adhesion layer and reach to the photodiode is increased. In the result, the smear component is increased.

Further, since the surface step becomes larger by the thickness of the ground adhesion layer, the thickness of the shielding layer is not able to be large sufficiently. In the result, the amount of the light penetrated through the shielding layer is not able to be ignored.

SUMMARY OF THE INVENTION

In the light of the foregoing problems, an object of the present invention is to provide a solid state imaging device which is insusceptible to the entrance of light into the charge transfer portion in CCD while maintaining a good adhesion to exhibit good smear characteristics.

In order to accomplish the foregoing object of the present invention, the solid state imaging device of the present invention comprises a light-shielding layer provided with an opening in a photodiode portion and covering a charge transfer portion through a ground adhesion layer made of one of titanium nitride and titanium provided interposed between the light shielding layer and a substrate on which the charge transfer portion and photodiode portion are formed.

A process for the production of a solid state imaging device of the present invention comprises forming one of a titanium nitride layer and a titanium layer as a ground adhesion layer for light-shielding layer provided with an opening in a photodiode portion and covering a charge transfer portion, and then forming a light-shielding layer on said ground adhesion layer.

According to another solid state imaging device of the present invention, the charge transfer electrode is a thin layer, and the ground adhesion layer made of one of a titanium nitride layer and a titanium layer.

Another process for the production of a solid state imaging device comprises forming one of a titanium nitride layer and a titanium layer as the ground adhesion layer, and then forming a charge transfer electrode made of a light shielding layer thereon on the ground adhesion layer.

A first aspect of the device is a solid state imaging device of the present invention, which comprises a photodiode portion formed on a substrate;
   a charge transfer portion for transfering a charge from the photodiode portion; and
   a light-shielding layer provided with an opening corresponding to the photodiode portion and covering the charge transfer portion, with a ground adhesion layer made of one of titanium nitride and titanium interposed between the light-shielding layer and the substrate.

According to the first aspect, an adhesive characteristic between the substrate and the ground adhesion layer is good and the light shielding effect is sufficiently high. Thereby multiple reflection is restrained and smear characteristic becomes good. Per se ground adhesion layer has a light shielding characteristic and then a thickness of the light shielding layer is able to make thinner. Thereby a flatness of the surface is improved.

A second aspect of the device is a solid state imaging device according to the first aspect, wherein the ground adhesion layer has a thickness of not less than 10 nm to not more than 200 nm. In the case that the thickness of the ground adhesion layer excesses 200 nm, a total thickness of the ground adhesion layer and the light shielding layer is too thick, the sensitivity is deteriorated. In the case that the thickness of the ground adhesion layer is thinner than 10nm, smear characteristic is deteriorated owing to the transmitted light.

A third aspect of the device is a solid state imaging device according to an second aspect, wherein the ground adhesion layer has a thickness of not less than 10 nm to not more than 70 nm. In the case that the thickness of the ground adhesion layer excesses 70 nm, it is difficult to determine a most effective thickness that satisfies both sensitivity and smear characteristic.

A fourth aspect of the device is a solid state imaging device according to the first aspect, wherein the light shielding layer is made of one of a refractory metal, a refractory metal silicide and aluminum compound. Since a refractory metal and a refractory metal have a tolerance to high temperature, a dark current by the damage of the substrate caused by the heat treatment is lowered. Though aluminum compound has not a sufficient tolerance to high temperature, aluminum compound reflection has a high coefficient and good light shielding effect. Thereby multiple reflection is restrained and smear characteristic becomes good.

A fifth aspect of the device is a solid state imaging device according to the fourth aspect, wherein the light shielding layer has a thickness of not less than 50 nm to not more than 350 nm. In the case that the thickness of the light shielding layer excesses 350 nm, it is difficult to determine a most effective thickness that satisfies both sensitivity and smear characteristic. In the case that the thickness of the light shielding layer is thinner than 10 nm, smear characteristic is deteriorated owing to the transmitted light.

A sixth aspect of the device is a solid state imaging device according to the fourth aspect, wherein the light shielding layer has a thickness of not less than 50 nm to not more than 100 nm. A thickness of the light shielding layer is able to make thinner, thereby a flatness of the surface is improved.

A seventh aspect of the device is a solid state imaging device according to the first aspect, wherein a thickness of the light shielding layer is more than five times of that of the ground adhesive layer. According to the seventh aspect, an adhesive characteristic between the substrate and the ground adhesion layer is better.

An eighth aspect of the device is a solid state imaging device according to the first aspect, wherein an edge of the ground adhesive layer is receded from that of the light shielding layer at the opening. According to the eighth aspect, the light in aslant is shielded sufficiently without being reached to thin ground adhesion layer. Therefore multiple reflection is prevented more completely.

A ninth aspect of the device is a solid state imaging device according to the first aspect, wherein the light shielding layer is made of one of titanium nitride and titanium. According to the ninth aspect, a single layer made of one of titanium nitride and titanium is capable to act as the ground adhesion layer by the light shielding layer. It is easy to fabricate the device.

A tenth aspect of the device is a solid state imaging device according to the first aspect, wherein the light shielding layer is formed so as to cover an edge of the ground adhesive layer at the opening. According to the tenth aspect, the light in aslant is shielded sufficiently without being reached to thin ground adhesion layer. Smear characteristic is improved more completely.

An eleventh aspect of the method is a method of fabricating a a solid state imaging device of the present invention, which comprises the steps of:
   forming a photodiode portion and a charge transfer portion on a substrate;
   forming one of a titanium nitride layer and titanium layer as a ground adhesion layer provided with an opening corresponding to the photodiode portion so as to cover the charge transfer portion, and
   then forming a light-shielding layer so as to cover an edge of the ground adhesion layer at the opening.

According to the eleventh aspect, the light in aslant is shielded sufficiently without being reached to thin ground adhesion layer. Smear characteristic is improved more completely.

A twelfth aspect of a device is a solid state imaging device of the present invention, which comprises:

a photodiode portion formed on a substrate; and a charge transfer portion for transfering a charge from the photodiode portion, formed on a substrate, wherein the charge transfer portion has a charge transfer electrode formed through a ground adhesion layer made of one of titanium nitride and titanium on the substrate.

According to the twelfth aspect, an adhesive characteristic between the substrate and the ground adhesion layer is good and the light shielding effect is sufficiently high. Thereby multiple reflection is restrained and smear characteristic becomes good. Per se ground adhesion layer has a light shielding characteristic and then a thickness of the charge transfer electrode is able to make thinner. Thereby a flatness of the surface is improved.

A thirteenth aspect of the device is a solid state imaging device according to the twelfth aspect, wherein the ground adhesion layer has a thickness of not less than 10 nm to not more than 200 nm. In the case that the thickness of the ground adhesion layer excesses 200 nm, a total thickness of the ground adhesion layer and the charge transfer electrode is too thick, the sensitivity is deteriorated. In the case that the thickness of the ground adhesion layer is thinner than 10 nm, sufficient transfer efficiency can not be obtained and smear characteristic is deteriorated owing to the transmitted light.

A fourteenth aspect of the device is a solid state imaging device according to the twelfth aspect, wherein the ground adhesion layer has a thickness of not less than 10 nm to not more than 50 nm. In the case that the thickness of the light shielding layer excesses 50 nm, it is difficult to determine a most effective thickness that satisfies both sufficient transfer efficiency and smear characteristic.

A fifteenth aspect of the device is a solid state imaging device according to the twelfth aspect, wherein the charge transfer electrode is made of one of a refractory metal and a refractory metal silicide. Since a refractory metal and a refractory metal have a tolerance to high temperature, a dark current by the damage of the substrate caused by the heat treatment is lowered.

A sixteenth aspect of the device is a solid state imaging device according to the fifteenth aspect, wherein the charge transfer electrode has a thickness of not less than 50 nm to not more than 200 nm.

A seventeenth aspect of the device is a solid state imaging device according to the fifteenth aspect, wherein the charge transfer electrode has a thickness of not less than 50 nm to not more than 100 nm. A thickness of the charge transfer electrode is able to make thinner, thereby a flatness of the surface is improved.

An eighteenth aspect of the device is a solid state imaging device according to the twelfth aspect, wherein a thickness of the charge transfer electrode is more than five times of that of the ground adhesive layer. According to the eighteenth aspect, an adhesive characteristic between the substrate and the ground adhesion layer is better.

A nineteenth aspect of the device is a solid state imaging device according to the twelfth aspect, wherein an edge of the ground adhesive layer is receded from that of the charge transfer electrode. According to the ninth aspect, a single layer made of one of titanium nitride and titanium is capable to act as the ground adhesion layer by the light shielding layer. It is easy to fabricate the device.

A twentieth aspect of the device is a solid state imaging device according to the twelfth aspect, wherein the charge transfer electrode is formed so as to cover an edge of the ground adhesive layer at the opening. According to the twentieth aspect, the light in aslant is shielded sufficiently without being reached to thin ground adhesion layer. Therefore multiple reflection is prevented more completely.

A twenty first aspect of the device is a solid state imaging device according to the twelfth aspect, wherein the charge transfer electrode is made of one of titanium nitride and titanium. According to the twenty first aspect, a single layer made of one of titanium nitride and titanium is capable to act as the ground adhesion layer by the charge transfer electrode. It is easy to fabricate the device.

A twenty second aspect of the method is a method of fabricating a solid state imaging device of the present invention, which comprises the steps of:

forming a photodiode portion; and forming a charge transfer portion on a substrate;

wherein the charge transfer portion forming step comprises the steps of:

forming one of a titanium nitride layer and titanium layer as a ground adhesion layer; and then forming a charge transfer electrode so as to cover an edge of the ground adhesion layer.

According to the twenty second aspect, the light in aslant is shielded sufficiently by the charge transfer electrode without being reached to thin ground adhesion layer. Therefore multiple reflection is prevented more completely.

DESCRIPTION OF THE PREFERRED EMBODIMENTS

Embodiments of the present invention will be described in connection with FIGS. 1 to 8.

First Embodiment

The first embodiment of the present invention will be described in connection with the attached drawings.

Figure 1:
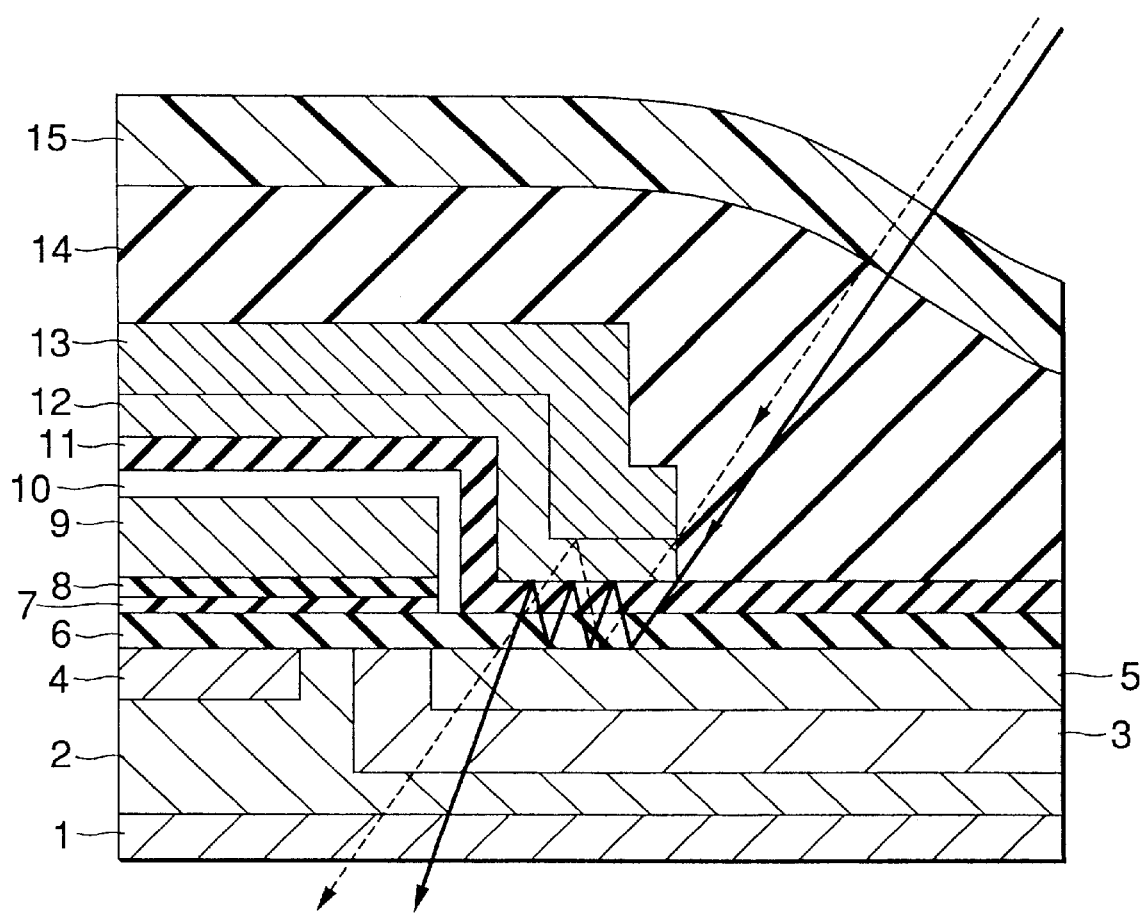
FIG. 1 is a sectional view illustrating the first embodiment of the solid state imaging device according to the present invention.

FIG. 1 is a sectional view illustrating the first embodiment. FIG. 2 is a sectional view of steps illustrating a process for the production of this embodiment.

In FIGS. 1 and 2, the reference numeral 1 indicates a semiconductor substrate made of an N-type silicon, the reference numeral 2 indicates a P-type region, and the reference numeral 3 indicates an N$^-$-type region in a photodiode portion on which an opening is provided. The reference numeral 4 indicates an N-type region in a vertical CCD portion. The reference numeral 5 indicates a P$^{++}$ region. The reference numeral 6 indicates a first silicon oxide layer, the reference numeral 7 indicates a silicon nitride layer, the reference numeral 8 indicates a second thin silicon oxide layer, the reference numeral 9 indicates a polycrystalline silicon electrode, the reference numeral 10 indicates a polycrystalline silicon oxide layer, the reference numeral 11 indicates a first interlayer insulating layer, the reference numeral 12 indicates a ground adhesion layer made of titanium nitride, the reference numeral 13 indicates a light-shielding layer made of tungsten or silicide, the reference numeral 14 indicates a second interlayer insulating layer, and the reference numeral 15 indicates a protective layer.

P-type impurities are diffused into a semiconductor substrate 1 made of an N-type silicon on one main plane thereof to form the P-type region 2. N-type impurities are then selectively diffused into the P-type region 2 on the one main plane side of the semiconductor substrate 1 by a known method so that an N$^-$-type region 3 in a photodiode portion and an N-type region 4 in a vertical CCD portion are formed a predetermined distance apart from each other. P-type impurities are then selectively diffused into the N-type region 3 on the one main plane side of the semiconductor substrate 1 to form a P$^{++}$ region 5 therein. A first silicon oxide layer 6 is then formed on the one main plane side of the semiconductor substrate 1 (FIG. 2 (a)).

Subsequently, a silicon nitride layer 7 and a second silicon oxide layer 8 are sequentially formed on the first silicon oxide layer 6. A polycrystalline silicon is then accumulated on the second silicon oxide layer 8 by CVD method under reduced pressure to form a polycrystalline silicon electrode 9 thereon (FIG. 2 (b)).

Subsequently, the laminate is subjected to dry etching so that the polycrystalline silicon electrode 9, the second silicon oxide layer 8 and the silicon nitride layer 7 are selectively removed away leaving the N-type region 4 and the region between the N-type region 4 and the P$^{++}$ region 5 unexposed (FIG. 2 (c)).

Subsequently, a polycrystalline silicon oxide layer 10 is formed covering the polycrystalline silicon electrode 9 and the side edge of the second silicon oxide layer 8 and the silicon nitride layer7 (FIG. 2 (d)). A first interlayer insulating layer 11, a ground adhesion layer 12 and a light-shielding layer 13 are sequentially laminated on the polycrystalline silicon oxide layer 10 and its side edge and on the first silicon oxide layer 6 (FIG. 2 (e)).

Figure 2A:
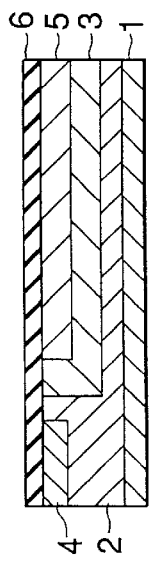
FIGS. 2a–2g are sectional views illustrating a process for the production of the solid state imaging device shown in FIG. 1.
Figure 2B:
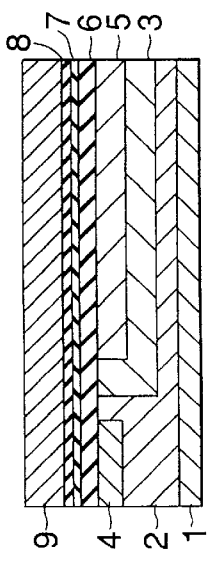
Figure 2C:
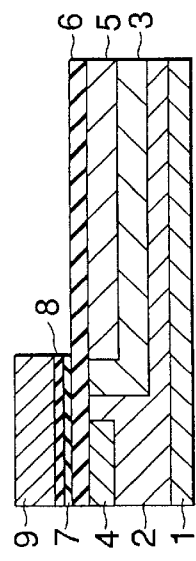
Figure 2D:
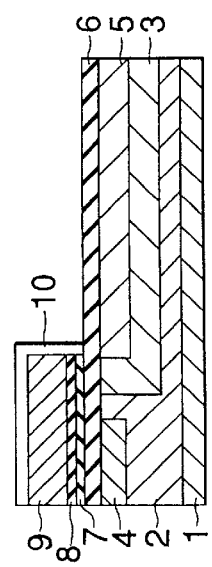
Figure 2E:
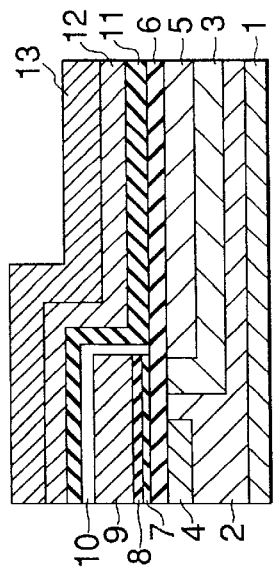
Figure 2F:
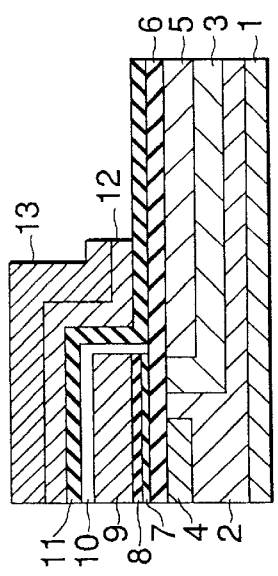
Figure 2G:
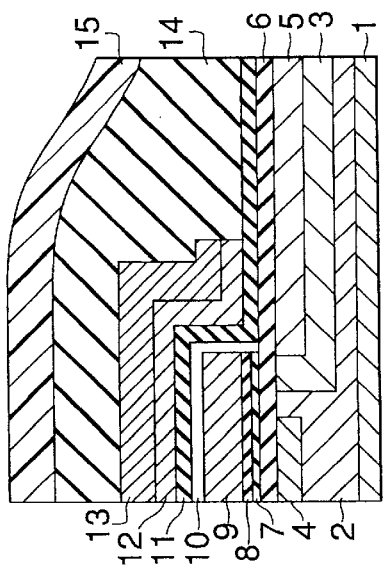

In this procedure, the ground adhesion layer 12 of the light-shielding layer 13 can be formed by sputtering titanium nitride onto the sublayer to a thickness of from not less than 10 nm to not more than 200 nm. The light-shielding layer 13 can be formed by accumulating tungsten or silicide thereof onto the sublayer by CVD method. Then as shown in FIG. 2(g), the light-shielding layer 13 and the ground adhesion layer 12 are removed selectively and the aperture is formed in the region corresponding to the photodiode region. The first interlayer insulating layer 11 remains on the light receiving region, too, without being removed.

An interlayer insulating layer 14 is then formed on the light-shielding layer 13 made of tungsten or silicide thereof and the first interlayer insulating layer 11.

Subsequently, the light-shielding layer 13, the ground adhesion layer 12 and the polycrystalline silicon oxide layer 10 are selectively removed leaving the region extending from the N-type region 4 to point on the P$^{++}$ region 5 close to the N$^{++}$-type region 3 unexposed (FIG. 2 (f)). A second interlayer insulating layer 14 and a protective layer 15 are sequentially laminated on the light-shielding layer 13 and its side edge and on the first interlayer insulating layer 11 (FIG. 2 (g)).

In this manner, a solid state imaging device as shown in FIG. 1 is prepared.

In the solid state imaging device thus prepared, the N$^-$-type region 3 in the P-type region 2 undergoes photoelectric conversion to generate signal charge which then migrates to the N-type region 4 in the vertical CCD portion when a pulse voltage 3is applied to the second layer polycrystalline silicon electrode 9 provided above the N-type region 4. Subsequently, when a pulse signal is applied alternately to a first layer polycrystalline silicon electrode and the second layer polycrystalline silicon electrode 9, signal charge is transferred.

As mentioned above, the light-shielding layer 13 made of a high melting metal such as tungsten or silicide thereof exhibits a great stress that gives a poor adhesion to the sublayer and thus can be easily peeled off the sublayer. The light-shielding layer 13 made of a high melting metal such as tungsten or silicide thereof, if formed on a polycrystalline silicon layer, exhibits a relaxed stress that gives an improved adhesion. However, if a polycrystalline silicon layer is used as an undercoat layer for the light-shielding layer 13, the thickness of the undercoat transparent layer for the light-shielding layer 13 increases, causing the leakage of light into the charge transfer portion and hence producing a smear component that deteriorates the properties of the solid state imaging device.

In the present invention, the ground adhesion layer 12 is formed by titanium nitride. The light-shielding layer 13made of a high melting metal or silicide thereof is formed on the ground adhesion layer 12 covering the N-type region 4 in the vertical CCD portion, the region between the N-type region 4 and the P$^{++}$ region 5 and a part of the P$^{++}$ region 5 adjacent thereto. The titanium nitride layer as ground adhesion layer 12 exhibits excellent light-shielding properties and a transmission of not more than $10^{-4}$ at a thickness of 200 nm. The titanium nitride layer doesn't exhibit deteriorated light-shielding properties even after heat treatment. Therefore, even if the titanium nitride layer is used as ground adhesion layer 12, it doesn't add to the transparent ground layer of the light-shielding layer 13, making it possible to effectively reduce the amount of light which undergoes multiple reflection to give a smear component that then reaches the charge transfer portion. Further, the titanium nitride layer is made of a low reflectivity material which is normally used as an anti-reflection layer and exhibits a reflectance of about 30% of that of aluminum layer and 50% of that of tungsten layer. Thus, the titanium nitride layer prevents light from being reflected by the other surface of the light-shielding layer 13 and entering into the charge transfer portion, making it possible to drastically reduce the production of a smear component.

The titanium nitride layer can maintain an excellent adhesion if its thickness is not less than 10 nm. In the case that the thickness of the titanium nitride layer exceeds 200 nm, the step coverage becomes wrong and the light shielding layer formed on the titanium nitride layer is easily peeled off.

Preferably the thickness of the titanium nitride layer is not less than 10 nm and not more than 50 nm. In the case that the thickness of the titanium nitride layer is within this range the step coverage is good and adhesive characteristic is improved, and smear characteristic is improved.

Figure 3:
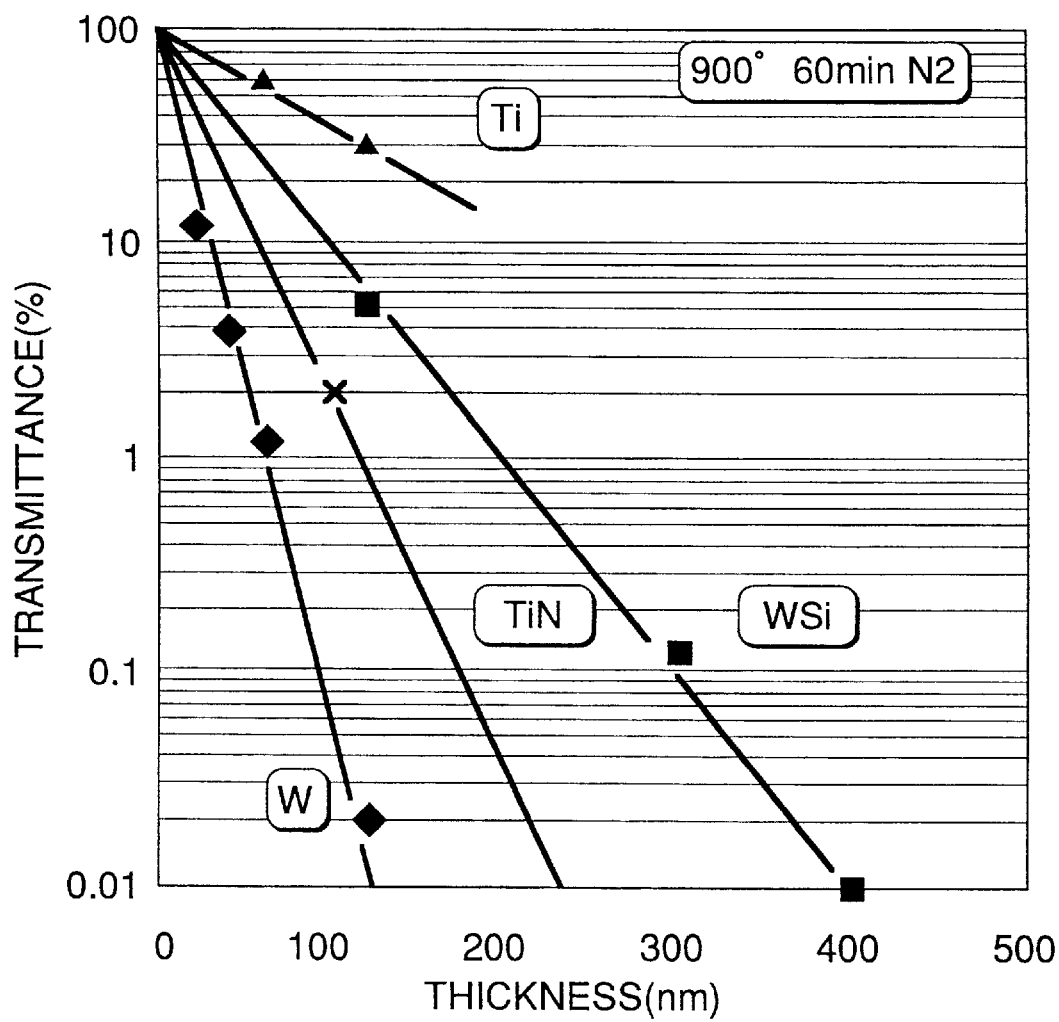
FIG. 3 shows a relation between a transmission coefficient and a thickness of the material used in the first embodiment of the solid state imaging device according to the present invention.

In order to analyze the effects, the relation of the thickness of the titanium nitride layer and the transmission coefficient is plotted as shown in FIG. 3. In order to compare, those of the tungsten, tungsten silicide, and titanium are also measured. The measurement is performed after heat-treatment at the temperature of 900° C. for 60 minutes in an nitrogen atmosphere.

Figure 4:
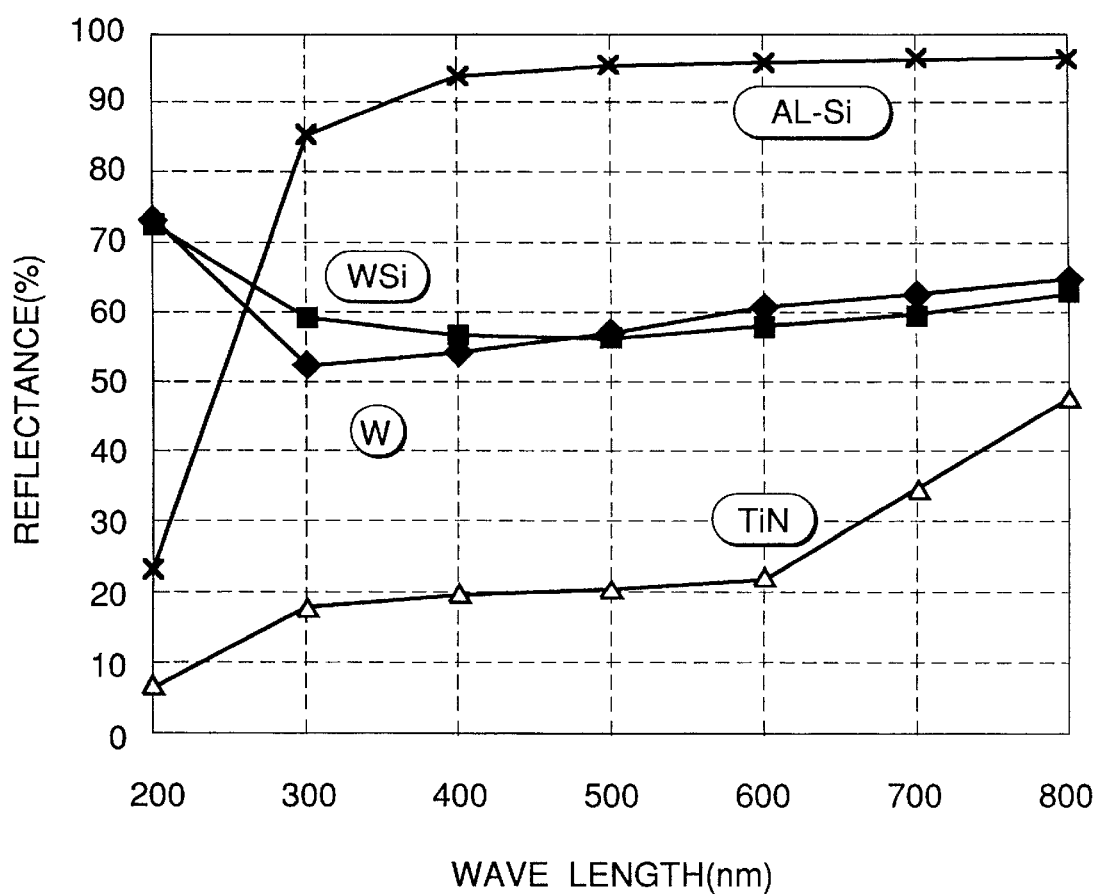
FIG. 4 shows a relation between a reflection coefficient and a thickness of the material used in the first embodiment of the solid state imaging device according to the present invention.

The relation of the reflection coefficient of the titanium nitride layer and the wavelength for measurement is plotted as shown in FIG. 4. In order to compare, those of the tungsten, tungsten silicide, and aluminum silicide are also measured.

In the case that a tungsten silicide is used as a light shielding layer, the thickness thereof is preferably 100 to 350 nm.

In the case that a tungsten is used as a light shielding layer, the thickness thereof is preferably 50 to 100 nm.

In the case that a molybdenum silicide is used as a light shielding layer, the thickness thereof is preferably 100 to 350 nm.

In the case that an aluminum compound is used as a light shielding layer, the thickness thereof is preferably 50 to 100 nm.

Second Embodiment

The second embodiment of the present invention will be described in connection with the attached drawings.

Figure 5:
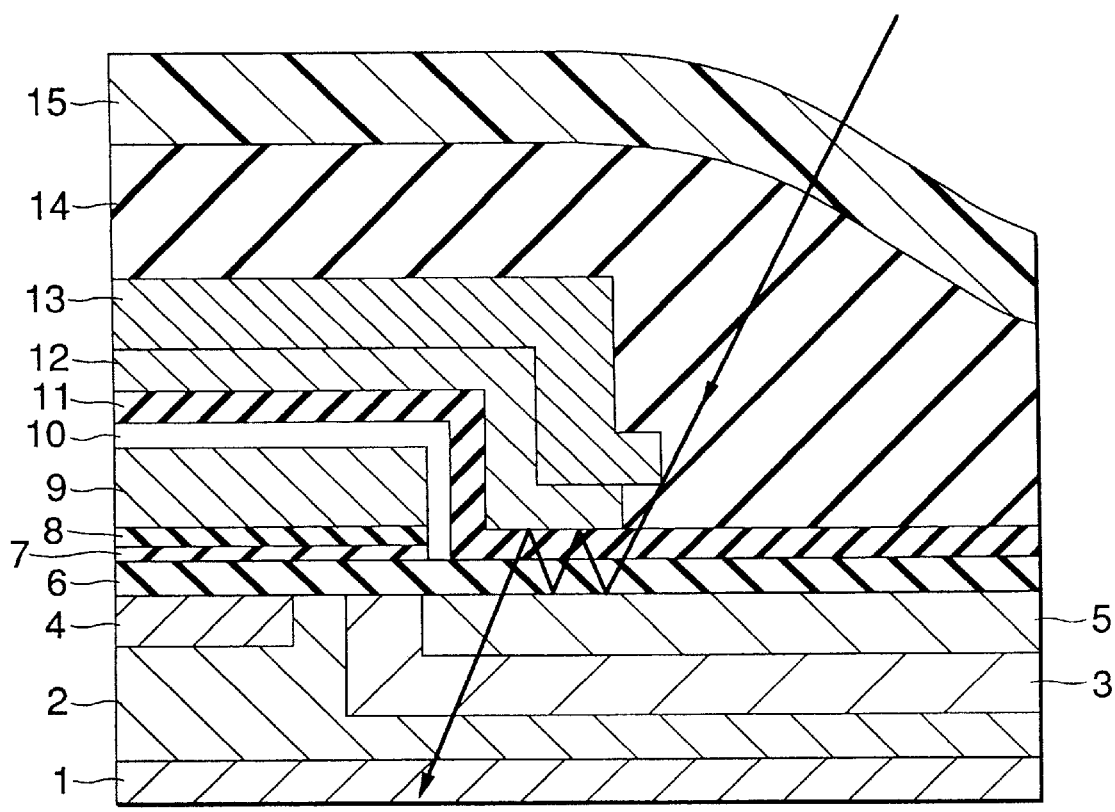
FIG. 5 is a sectional view illustrating the second embodiment of the solid state imaging device according to the present invention.

FIG. 5 is a sectional view illustrating the second embodiment of the present invention. In the embodiment, the edge of the ground adhesive layer 12 is receded relative to that of the light shielding layer 13. According to the structure, the light in aslant is shielded sufficiently as shown by arrow without being reached to thin ground adhesion layer. Therefore multiple reflection is prevented more completely.

In the case of manufacturing, the above structure can be fabricated easily by selecting an etching condition for patterning the ground adhesive layer 12 and the light shielding layer 13, so that only the ground adhesive layer 12 is selectively side-etched.

Third Embodiment

Figure 6:
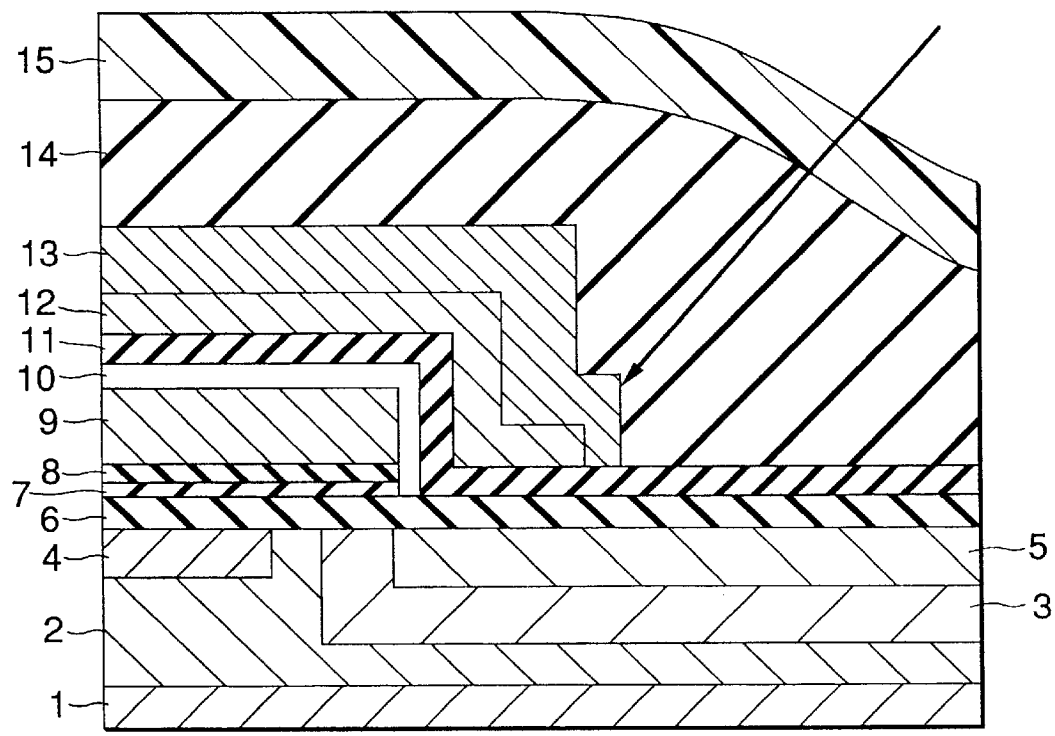
FIG. 6 is a sectional view illustrating the third embodiment of the solid state imaging device according to the present invention.

According to the third embodiment of the present invention, it is also be able to cover an edge of the ground adhesive layer 12 with the light shielding layer 13 as shown in FIG. 6. According to the structure, the light in aslant penetrated is shielded sufficiently as shown by arrow without being reached to thin ground adhesion layer. Therefore multiple reflection is prevented more completely.

Figure 7E:
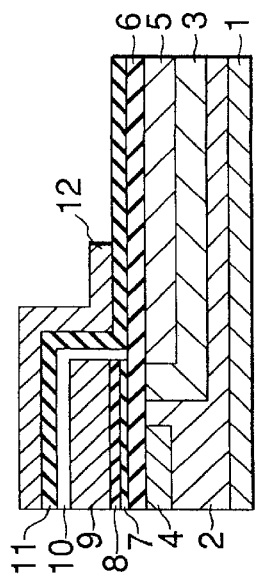
FIGS. 7a–7g are sectional views illustrating a process for the production of the solid state imaging device shown in FIG. 6.

The steps of fabricating the device is shown in FIGS. 7(a) to 7(g). In the step of fabricating the device, the steps of shown in FIGS. 7(a) to 7(d) are performed in the same way as that of the first embodiment, by oxidizing the polycrystalline silicon electrode 9, the silicon oxide layer 10 and the silicon oxide layer as a first interlayer insulating film 11 are formed in order. And then the titanium nitride layer is further formed by a sputtering method and a pattern of the ground adhesive layer 12 is formed as shown in FIG. 7(e).

Figure 7F:
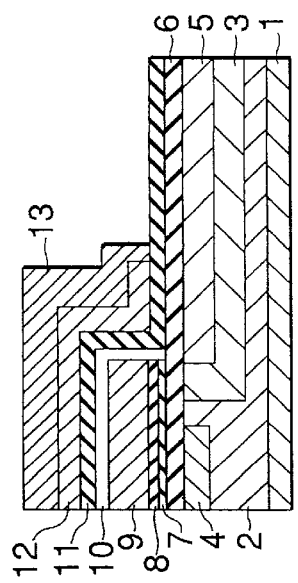

And then a tungsten film as a light shielding layer is formed by reduced pressure CVD method and a pattern of a light shielding layer is formed by dry etching as shown in FIG. 7(f).

Figure 7G:
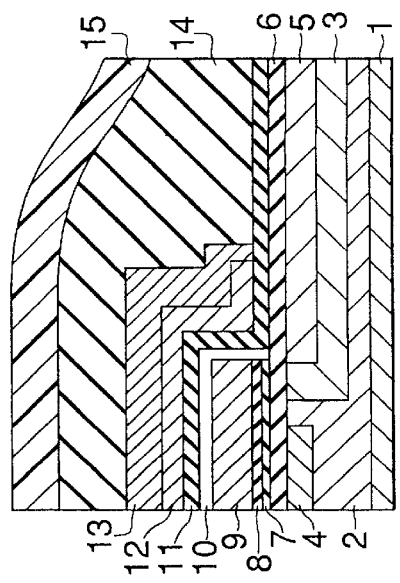
Figure 7A:
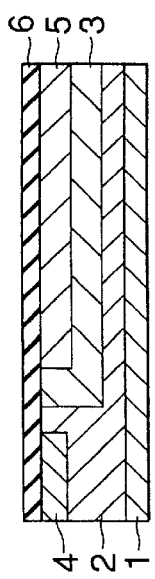
Figure 7B:
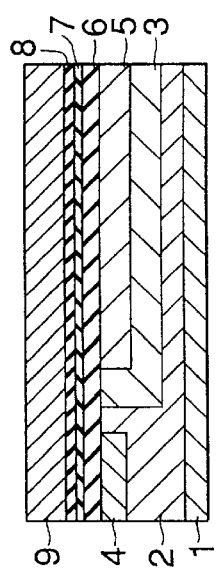
Figure 7C:
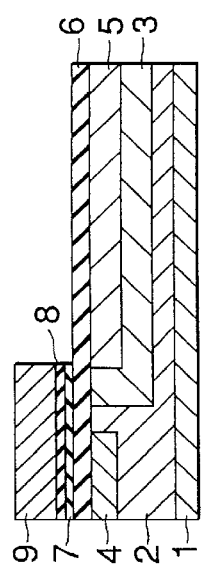
Figure 7D:
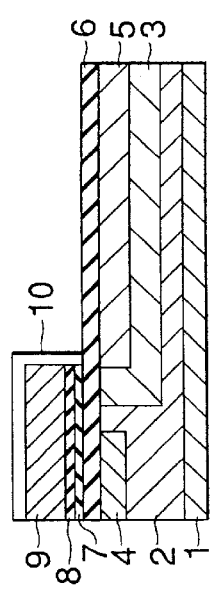

Then as shown in FIG. 7(g), the second interlayer insulating film 14 and protective layer 15 are formed to be solid state imaging device as shown in FIG. 6.

Fourth Embodiment

The fourth embodiment of the present invention will be described in connection with the attached drawings.

Figure 8:
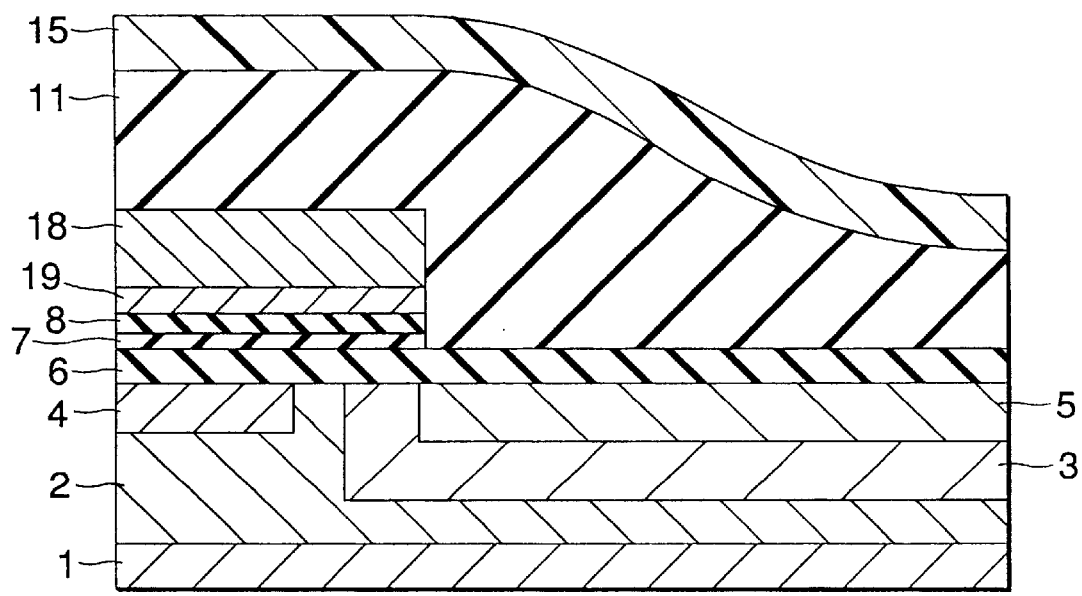
FIG. 8 is a sectional view illustrating the fourth embodiment of the solid state imaging device according to the present invention.
Figure 9A:
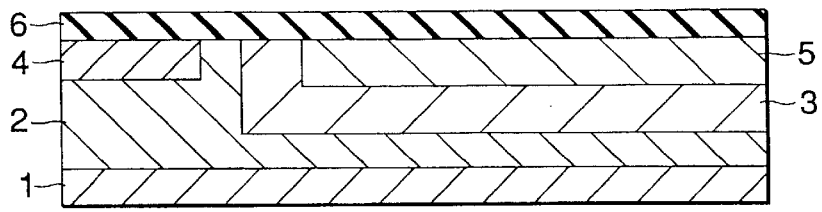
FIGS. 9a–9e are sectional views illustrating a process for the production of the solid state imaging device shown in FIG. 8.
Figure 9B:
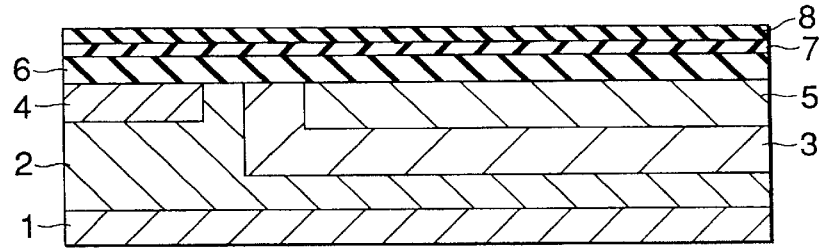
Figure 9C:
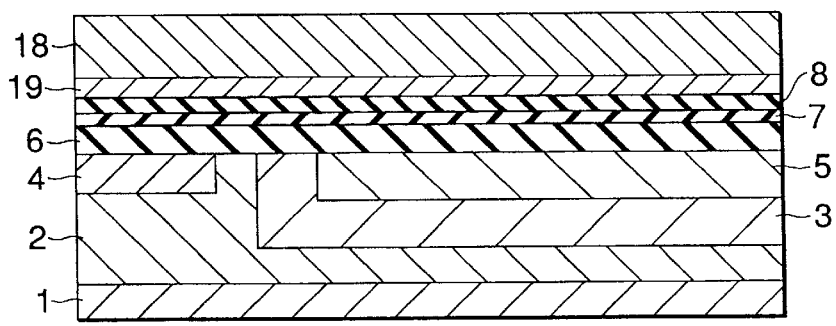
Figure 9D:
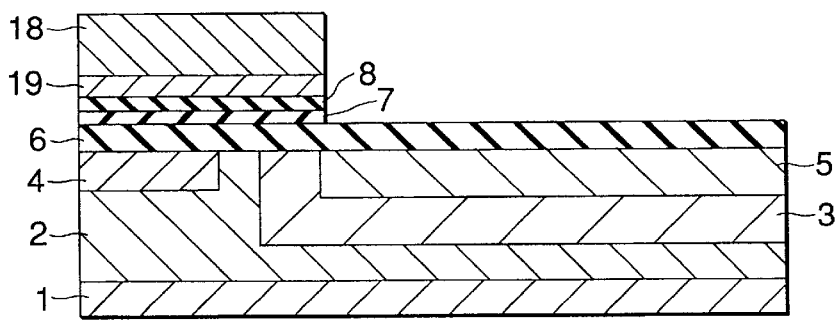
Figure 9E:
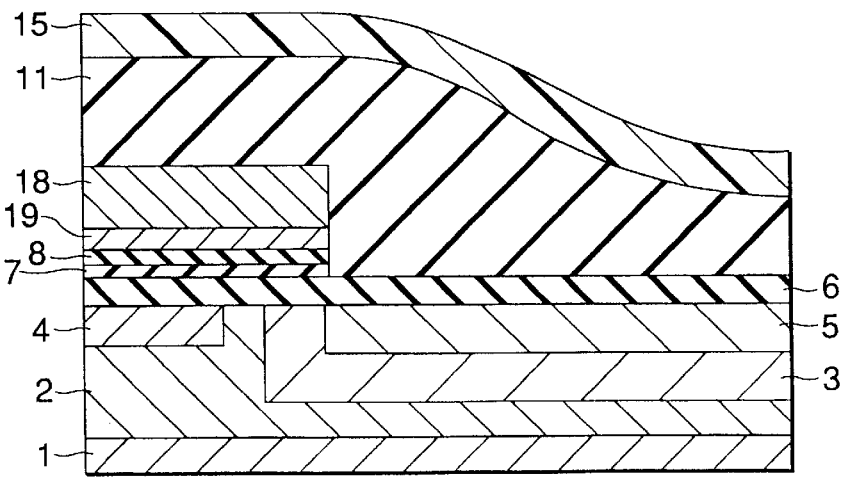
Figure 10:
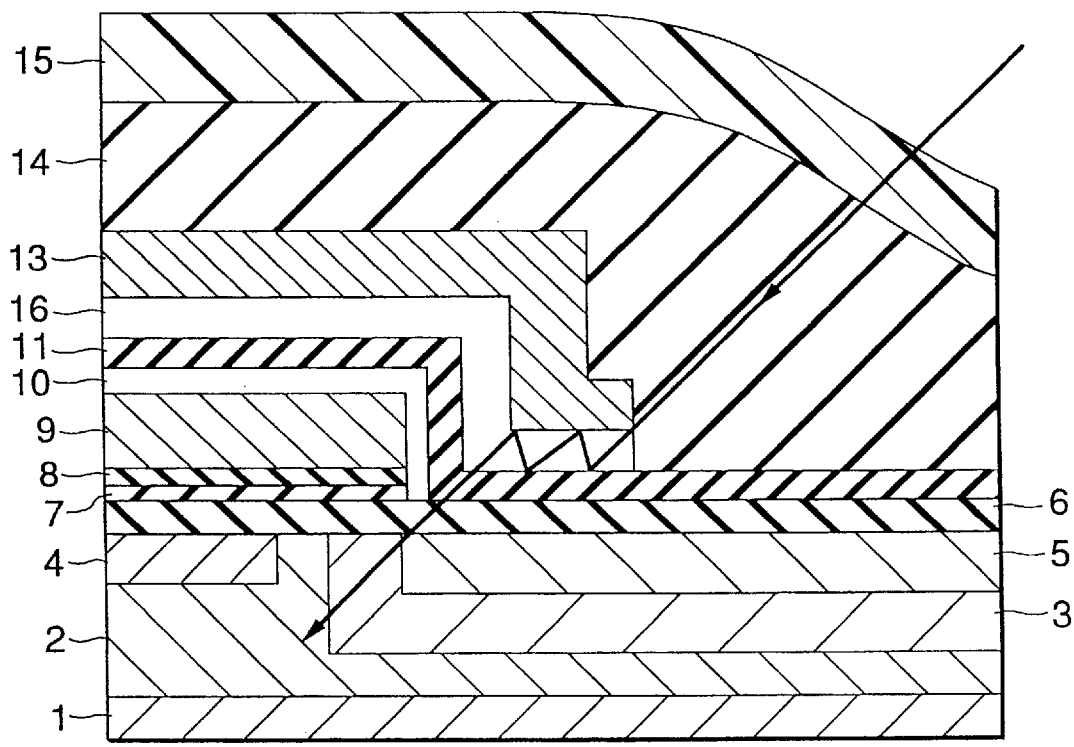
FIG. 10 is a sectional view illustrating an example of a prior art solid state imaging device.
Figure 11:
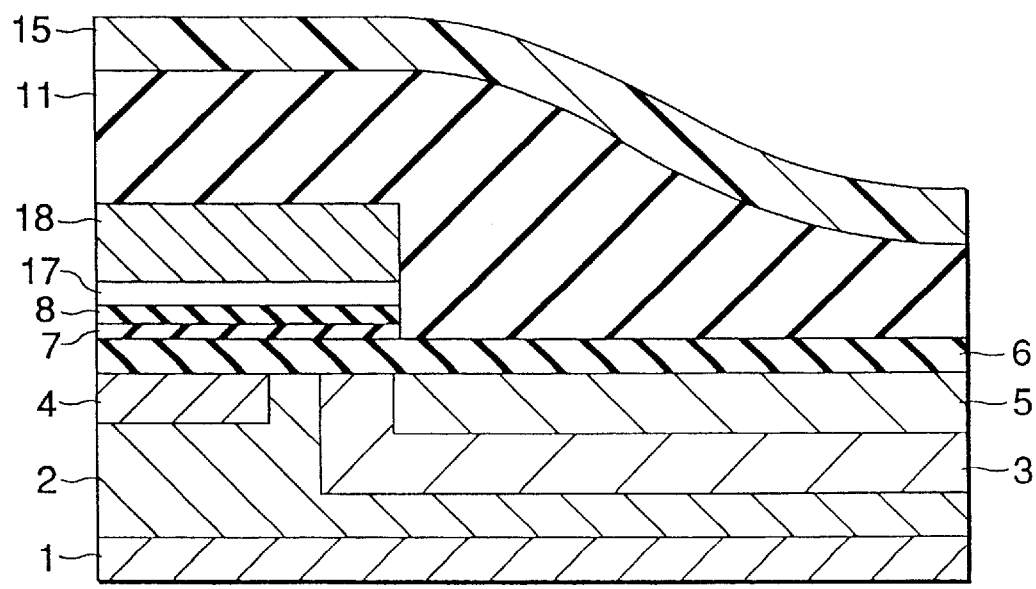
FIG. 11 is a sectional view illustrating another example of a prior art solid state imaging device.

FIG. 8 is a sectional view illustrating the second a2 embodiment of the present invention. FIG. 9 is a sectional view of steps illustrating the process for the production of the second embodiment of the present invention.

In FIGS. 8 and 9, the reference numeral 18 indicates a charge transfer electrode made of a high melting metal such as tungsten or silicide thereof, and the reference numeral 19 indicates a ground adhesion layer made of titanium nitride. Like numerals are used where the constituents are the same as those of FIGS. 1 and 2.

P-type impurities are diffused into a semiconductor substrate 1 made of an N-type silicon on one main plane thereof to for a P-type region 2. N-type impurities are then selectively diffused into the P-type region 2 on the one main plane side of the semiconductor substrate 1 by a known method so that an N$^-$-type region 3 in a photodiode portion and an N-type region 4 in a vertical CCD portion are formed a predetermined distance apart from each other. P-type impurities are then selectively diffused into the N-type region 3 on the one main plane side of the semiconductor substrate 1 to form a P$^{++}$ region 5 therein. A first silicon oxide layer 6 is then formed on the one main plane side of the semiconductor substrate 1 (FIG. 9 (a)).

Subsequently, a silicon nitride layer 7 and a second silicon oxide layer 8 are sequentially formed on the first silicon oxide layer 6 (FIG. 9 (b)).

Subsequently, titanium nitride is sputtered or otherwise accumulated onto the second silicon oxide layer 8 to a thickness of not less than 10 nm to not more than 200 nm to form a ground adhesion layer 19. A high melting point such as tungsten or silicide thereof is then accumulated on the ground adhesion layer 19 by CVD method or the like to form a charge transfer electrode 18 (FIG. 9 (c)).

Subsequently, the laminate is subjected to dry etching so that the charge transfer electrode 18, the ground adhesion layer 19 and the second silicon oxide layer 8 are selectively removed away leaving the N-type region 4 and the region between the N-type region 4 and the P$^{++}$ region 5 unexposed (FIG. 9 (d)).

Subsequently, an interlayer insulating layer 11 and a protective layer 15 are sequentially formed on the charge transfer electrode 18 and the side edge of the ground adhesion layer 19 and the second silicon oxide layer 8 to obtain a solid state imaging device as shown in FIG. 8 (FIG. 9 (e)).

In the solid state imaging device, the charge transfer portion is alternatively discriminated as first phase electrode and second phase electrode, and signal charge which has been generated when the N$^-$-type region 3 in the P-type region 2 undergoes photoelectric conversion migrates to the N-type region 4 in the vertical CCD portion under the second phase electrode 9 when a pulse voltage is applied to the second phase electrode. Subsequently, a pulse signal is alternately applied to the first phase electrode and the second phase electrode so that signal charge is transferred.

In this embodiment, a ground adhesion layer 19 having a thickness of from not less than 10 nm to not more than 200 nm made of titanium nitride is provided on an N-type region 4 and a region between the N-type region 4 and a P$^{++}$ region 5, and a charge transfer electrode 18 made of tungsten or silicide thereof is provided on the ground adhesion layer 19.

In this arrangement, the resulting solid state imaging device exhibits excellent adhesion and light-shielding properties and doesn't show deteriorated light-shielding properties even after heat treatment similarly to the first embodiment.

In the case that a tungsten silicide is used as a charge transfer electrode, the thickness thereof is preferably 100 to 200 nm.

In the case that a tungsten is used as a charge transfer electrode, the thickness thereof is preferably 50 to 100 nm.

In the case that a molybdenum silicide is used as a light shielding layer, the thickness of the light shielding layer is preferably 100 to 200 nm.

In the case that an aluminum compound is used as a charge transfer electrode, the thickness thereof is preferably 50 to 100 nm.

With respect to the charge transfer electrode, in the same way as the second and third embodiments, the structure that the edge of the ground adhesive layer is covered with the charge transfer electrode or the edge of the ground adhesive layer is receded with respect to that of the charge transfer electrode is effective. According to the structure, the light in aslant is shielded sufficiently as shown by arrow without being reached to ground adhesion layer. Therefore multiple reflection is prevented more completely.

The solid state imaging device according to the present invention comprises on of a titanium nitride layer and a titanium layer as a ground adhesion layer for a light shielding layer or charge transfer electrode of a solid state imaging device and thus exhibits improved smear properties while maintaining a good adhesion.

What is claimed is:

1. A solid state imaging device, comprising:

a photodiode portion formed on a substrate;

a charge transfer portion for transferring a charge from the photodiode portion;

an interlayer insulating layer provided on the photodiode portion and the charge transfer portion; and a light-shielding layer provided on the interlayer insulating layer with an opening corresponding to the photodiode portion and covering the charge transfer portion, wherein a ground adhesion layer made of one of titanium nitride and titanium is disposed between and in contact with the light-shielding layer and the interlayer insulating layer.

2. The solid state imaging device as claimed in claim 1, wherein the ground adhesion layer has a thickness of not less than 10 nm to not more than 200 nm.

3. The solid state imaging device as claimed in claim 2, wherein the ground adhesion layer has a thickness of not less than 10 nm to not more than 70 nm.

4. The solid state imaging device as claimed in claim 1, wherein the light shielding layer is made of one of a refractory metal, a refractory metal silicide and an aluminum compound.

5. The solid state imaging device as claimed in claim 4, wherein the light shielding layer has a thickness of not less than 50 nm to not more than 350 nm.

6. The solid state imaging device as claimed in claim 4, wherein the light shielding layer has a thickness of not less than 50 nm to not more than 100 nm.

7. The solid state imaging device as claimed in claim 1, wherein a thickness of the light shielding layer is more than five times a thickness of the ground adhesive layer.

8. The solid state imaging device as claimed in claim 1, wherein an edge of the ground adhesive layer is receded from an edge of the light shielding layer at the opening.

9. The solid state imaging device as claimed in claim 1, wherein the light shielding layer is made of one of titanium nitride and titanium.

10. The solid state imaging device as claimed in claim 1, wherein the light shielding layer is formed so as to cover an edge of the ground adhesive layer at the opening.

11. A solid state imaging device, comprising:

a photodiode portion formed on a substrate; and a charge transfer portion for transferring a charge from the photodiode portion, said charge transfer portion including a charge transfer electrode;

wherein the charge transfer electrode is formed on a ground adhesion layer and the ground adhesion layer is disposed between the charge transfer electrode and the substrate, said ground adhesion layer being made of one of titanium nitride and titanium.

12. The solid state imaging device as claimed in claim 11, wherein the ground adhesion layer has a thickness of not less than 10 nm to not more than 200 nm.

13. The solid state imaging device as claimed in claim 11, wherein the ground adhesion layer has a thickness of not less than 10 nm to not more than 50 nm.

14. The solid state imaging device as claimed in claim 11, wherein the charge transfer electrode is made of one of a refractory metal and a refractory metal silicide.

15. The solid state imaging device as claimed in claim 14, wherein the charge transfer electrode has a thickness of not less than 50 nm to not more than 200 nm.

16. The solid state imaging device as claimed in claim 14, wherein the charge transfer electrode has a thickness of not less than 50 nm to not more than 100 nm.

17. The solid state imaging device as claimed in claim 14, wherein a thickness of the charge transfer electrode is more than five times a thickness of the ground adhesive layer.

18. The solid state imaging device as claimed in claim 11, wherein an edge of the ground adhesive layer is receded from an edge of the charge transfer electrode.

19. The solid state imaging device as claimed in claim 11, wherein the charge transfer electrode is formed so as to cover an edge of the ground adhesive layer.

20. The solid state imaging device as claimed in claim 11, wherein the charge transfer electrode is made of one of titanium nitride and titanium.

* * * * *